United States Patent [15] 3,649,847
Limberg [45] Mar. 14, 1972

[54] ELECTRICALLY CONTROLLED ATTENUATION AND PHASE SHIFT CIRCUITRY

[72] Inventor: Allen LeRoy Limberg, Sommerville, N.J.
[73] Assignee: RCA Corporation

[22] Filed: Oct. 30, 1970
[21] Appl. No.: 85,401

[52] U.S. Cl. ....307/237, 307/262, 307/264, 328/171, 330/29
[51] Int. Cl. ....H03k 5/08
[58] Field of Search ....307/237, 262, 264; 328/168, 328/169, 171, 172; 330/29

[56] References Cited

UNITED STATES PATENTS 3,310,688 3/1967 Ditkofsky ....307/237 X
3,441,749 4/1969 Rasiel et al. ....307/237
3,533,005 10/1970 Alm ....330/29

*Primary Examiner*—Stanley T. Krawczewicz
*Attorney*—Eugene M. Whitacre

[57] ABSTRACT

Input signal current combined with a substantially constant direct current bias is coupled to the junction of the emitter electrode of a transistor biased in common base configuration and one electrode of a diode poled similarly to the base-emitter junction of the transistor. A variable direct current supply is coupled to the other electrode of the diode. The collector of the transistor provides an output signal current, the average value of which is complementary to the average current flow through the diode. An electrically controlled attenuator is thus provided. This attenuator mechanism can be used to regulate a reactive current flow in phase shift circuitry to afford electrically controlled phase shift networks. Such electrically controlled attenuation and phase shift circuitry is well suited for use in remotely controlled television receivers and lends itself to monolithic integrated circuit construction.

14 Claims, 6 Drawing Figures

INVENTOR
ALLEN L. LIMBERG
BY
Kenneth R. Schaefer
ATTORNEY

INVENTOR
ALLEN L. LIMBERG
BY Kenneth R. Schaefer
ATTORNEY

INVENTOR
ALLEN L. LIMBERG
BY
Kenneth R. Schaefer
ATTORNEY

ELECTRICALLY CONTROLLED ATTENUATION AND PHASE SHIFT CIRCUITRY

This invention relate to variable electrical impedance circuits and more particularly to electrically controlled attenuation or phase shift circuitry which lends itself to construction using integrated circuitry and is particularly useful in electrically controlled volume, tint, contrast and fine tuning controls for television receivers.

Electrically controlled semiconductor attenuators or variable impedances exist in the prior art. Variations of the transconductance of a single transistor device by varying its bias is well known but has the disadvantage of introducing distortion for all but small signal operation. Another known attenuation technique involves coupling currents to the joined emitter electrodes of two variable conductance transistors each arranged in a common base configuration. The offset bias voltage between the base electrodes of the two transistors is varied to control the proportions of signal and bias currents flowing to the collector electrodes of each transistor, thereby achieving electrically controlled attenuation such as may be used in AGC systems. The latter method suffers from the characteristic that it is sensitive to spurious variations in the offset bias voltage between the transistor base electrodes.

A further type of electrically controlled attenuator is described in copending U.S. application Ser. No. 829,510, now abandoned, filed June 22, 1969 which is assigned to the same assignee as the present invention. The attenuator embodiments described in that application employ the combination of a common base transistor amplifier and a semiconductor diode coupled in common to a source of signals so as to provide alternate paths for signal currents. Signal currents coupled through the diode are bypassed to a reference point while signal currents coupled through the transistor are supplied to a load impedance. Quiescent (direct) currents associated with the diode and transistor are returned to a reference point via a common direct current path including a resistor. The impedance of the diode is varied by coupling the combination of a source of direct voltage and a variable resistance to the diode. As the direct current supplied to the diode from the source is varied, the division of signal current between the diode and transistor also is varied to provide the desired attenuation.

Such an arrangement is useful in connection with electrical attenuators fabricated in integrated circuit form since, for example, the direct voltage source, variable resistor and signal bypass capacitor associated with the diode all may be external, discrete components which can be coupled to the diode via a signal terminal on the integrated circuit chip. In the integrated circuit environment (or under some conditions in discrete circuits), where limited voltage supplies are available, if a simple common resistor is used as the return path in the above-described configuration, a compromise must be made selecting the value of the resistor. That is, a relatively large resistor provides the desired high source impedance and consequently reduces circuit variations due to supply voltage variations but, at the same time, reduces the available output signal range and control current range. On the other hand, if the resistor is small, the circuit is undesirably subject to variations as supply voltage varies. Furthermore, in the integrated circuit area, it may be desirable to compensate for temperature variation of circuit parameters associated with the attenuator.

In accordance with the present invention, a variable electrical impedance circuit comprises first and second semiconductor devices, the first device having at least first and second electrodes and the second device having first, second and third electrodes. Means are provided for coupling signals and a substantially constant, relatively high impedance, high level quiescent direct current path to the joined second electrodes of the devices. The current path includes a transistor having a collector direct current coupled to the joined second electrodes of the two devices. Means are provided between the base the emitter electrodes of the transistor for biasing the transistor to a substantially constant quiescent current level.

The first electrode of the second device is coupled to a reference voltage while output signal utilization means are coupled to the third electrode of the second device. Means are also provided for coupling a source of variable direct current to the first electrode of the first device whereby division, between the first and second devices, of direct current coupled from the source to the transistor direct current path may be controlled to produce a variation in the proportioning of signal currents as between the first and second devices.

The novel features that are considered characteristic of this invention are set forth with particularity in the appended claims. The invention itself, however, both as to its organization and method of operation, as well as objects thereof will best be understood from the following description when read in connection with the accompanying drawing in which:

Figure 1:
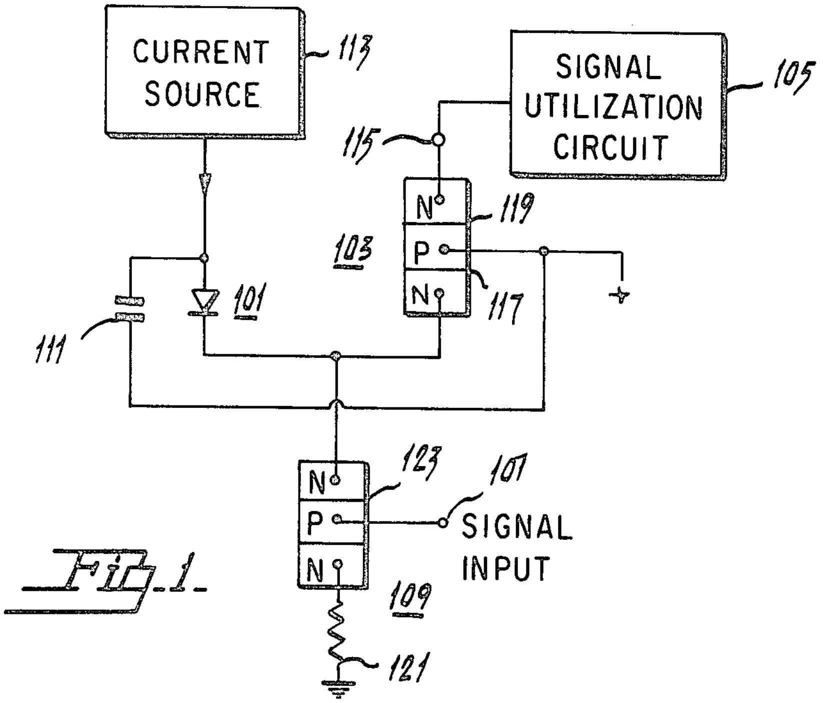
FIG. 1 illustrates, partially in block diagram and partially in schematic circuit diagram form, one embodiment of the present invention.

Referring to FIG. 1, a first semiconductor device shown as a diode 101 and a second semiconductor device shown as an NPN transistor 103 are interconnected to provide first and second current paths. The cathode of diode 101 is directly connected to the emitter of transistor 103. Input signal current is supplied to the cathode-emitter connection via input terminal 107. A substantially constant valued direct current sink 109 also is coupled to the cathode-emitter connection of diode 101 and transistor 103. The base electrode of transistor 103 is connected to a point of reference potential (e.g., ground). A signal bypass capacitor 111 is coupled between the anode of diode 101 and the point of reference potential. A current source 113 is coupled to the anode of diode 101 and provides operating current, the average value of which may be varied as will be set forth below. The collector of transistor 103 is coupled to an output terminal 115 which, in turn, is coupled to an output signal utilization circuit (or load) 105.

The direct current sink 109 comprises an NPN transistor 123 having collector, base and emitter electrodes coupled to the respective portions of the transistor 123. A resistor 121 is directly connected between the emitter of transistor 123 and a point of reference potential more negative than that at the base of transistor 103. The collector of transistor 123 is direct current connected to the cathode-emitter connection of diode 101 and transistor 103. Input signals and appropriate biasing are coupled to the base of transistor 123 to produce the desired current in resistor 121 as will appear below.

The operation of the circuit of FIG. 1 will be described for the following conditions. A positive voltage is provided across the collector-to-base semiconductor junction 119 of transistor 103 by means (not shown) within signal utilization circuit 105 to reverse bias junction 119 and to cause transistor 103 to function as a common base amplifier. Input signal current is supplied at terminal 107 with no direct current component, and, for linear operation, such signal current is constructed to have an instantaneous peak value less than the constant current requirement of the current sink 109. Current sink 109 is arranged to require a substantially constant current level which is supplied by the combination of input signal current at terminal 107, the current in diode 101 and the emitter current of transistor 103. The direct current bias in diode 101 is determined by the average value of the current supplied by current source 113.

Variation of direct current supplied by source 113 will produce substantially equal but opposite variation of the direct component of emitter current in transistor 103. As direct current is supplied to diode 101 and to the base-emitter of transistor 103, forward bias voltages are developed across these junctions which may be expressed to a good degree of accuracy in terms of the well-known semiconductor diode equation:

$$I = I_o\left(e\frac{qV}{kT} - 1\right) \qquad (1)$$

where I = current through the semiconductor junction in amperes $I_o$ = saturation current through semiconductor junction in amperes V = forward bias across the semiconductor junction in volts $q$ = unit charge on an electron in coulombs $k$ = Boltzmann's constant T = absolute temperature in degrees Kelvin $e$ = natural logarithm base The term $e\,(qV/kT)$ is normally much larger than unity and the expression may be simplified as follows:

$$I = I_o e^{\frac{qV}{kT}} \qquad (2)$$

If the parameters relating to diode 101 are identified by the addition of the subscript D and those relating to the base-emitter of transistor 103 are identified by the addition of the subscript Q, the relationship between current flow in such junctions when both junctions are at the same temperature may be desired as follows:

$$I_D = I_{D_o} e^{\frac{qV_D}{kT}} \qquad (3a)$$

$$I_Q = I_{Q_o} e^{\frac{qV_Q}{kT}} \qquad (3b)$$

$$\frac{I_Q}{I_D} = \frac{I_{Q_o}}{I_{D_o}} e^{\frac{q(V_Q - V_D)}{kT}} \qquad (4)$$

$$(V_Q - V_D) = \frac{kT}{q}\ln\left(\frac{I_{D_o}}{I_{Q_o}}\right)\left(\frac{I_Q}{I_D}\right) \qquad (5)$$

$$(V_Q - V_D) = \frac{kT}{q}\ln\frac{I_{D_o}}{I_{Q_o}} + \frac{kT}{q}\ln\frac{I_Q}{I_D} \qquad (6)$$

$$\frac{kT}{q}\ln\frac{I_{D_o}}{I_{Q_o}} = p, \qquad (7)$$

a constant voltage for any given temperature T.

$$(V_Q - V_D - p) = \frac{kT}{q}\ln\frac{I_Q}{I_D} \qquad (8)$$

Equation 8 makes it apparent that the ratio of the base-emitter current of transistor 103 to the cathode current of diode 101 is dependent upon the difference in the junction voltage offsets of the diode 101 and the base-emitter junction 117. Since these junction voltages are referred to a common interconnection (the joined emitter-cathode connection), their difference may be expressed as the difference in voltage between the anode electrode of diode 101 and the base electrode of transistor 103, $V_A$, which yields:

$$(V_A + p)\ .\ \frac{kT}{q}\ln\frac{I_Q}{I_D} \qquad (9)$$

It is to be noted that the ratio of current in base-emitter junction 117 to current in diode 101 is fixed for a given temperature by the potential ($V_A$ 30 p) without regard to the absolute values of these currents. Thus, as signals are supplied, if the voltage ($V_A$ + p) is held constant, the ratio of these currents is the same for signal variations as for the direct bias component. Signal bypass capacitor 111 prevents variations from appearing at the anode of diode 101, thereby preventing the voltage ($V_A$ + p) from varying in response to signal currents flowing through diode 101.

The direct current ($I_D$) of diode 101 therefore will be equal to the direct current supplied by source 113. The sum of the direct currents $I_D$ of diode 101 and $(\beta + 1)I_Q$ where $\beta$ is the current gain of transistor 103) will be equal to the constant direct current required by current sink 109. Thus:

$$I_D + (\beta + 1)I_Q = I_{113} + (\beta + 1)I_Q = I_{109} \qquad (10)$$

Substituting for $I_D$ and $I_Q$ in Equation 9 will yield a formula for the self-regulating biasing of the circuit of FIG. 1:

$$(V_A + p) = \frac{kT}{q}\ln\left[\frac{1}{\beta + 1}\left(\frac{I_{109}}{I_{113}} - 1\right)\right] \qquad (11)$$

Since $I_{109}$ is specified to be constant, the potential ($V_A$ + p) can be controlled by varying $I_{113}$, the average current afforded by the constant current source 113.

There is no impediment to this; the signal bypass capacitor 111 does not constrain the direct biasing of the anode of diode 101. The anode of diode 101 is free to seek a potential which permits the current constraints of Equation 11 to obtain. The voltage at the interconnection of the cathode of diode 101 and the emitter of transistor 103 is free to vary.

From the mathematical analysis supra, in particular Equation 11, it follows that the average current afforded by the current source 113 as related to the direct current required by the constant current sink 109 will determine the attenuation of the circuit of FIG. 1 for signal current. The circuit of FIG. 1 is therefore an electrically controlled attenuator network.

The illustrated direct current sink comprising transistor 123 and resistor 121 is capable of providing a relatively high quiescent current at a higher source impedance than the impedance of resistor 121 alone. Transistor 123 may be operated over a relatively wide range of currents between, but excluding, saturation and cutoff, while exhibiting a substantially flat collector current versus collector voltage characteristic. This is particularly so where, as in the illustrated case, the emitter electrode of transistor 123 is coupled to a signal reference potential via a degeneration resistor (i.e., resistor 121). The input (e.g., emitter-base) impedance of the devices 101 and 103 will vary according to the applied current level. That is, such input impedance will increase for low applied currents. However, the source impedance at the collector electrode of transistor 123 may be considered to be high (as compared to the input impedances of transistors 103 and diode 101), whether transistor 123 provides high or low current to transistors 103 and diode 101. It is therefore possible, with the illustrated arrangement to couple relatively large signal variations to the base of transistor 123 without introducing distortion. This configuration therefore provides an attenuator having the capability of handling a relatively wide dynamic signal range in the linear manner. This result can be achieved with a relatively low voltage difference between the reference terminal end of resistor 121 and the reference potential applied to the base of transistor 103 (e.g., of the order of two volts). It should also be noted that the combination of transistor 103 and 123 can be arranged to provide signal gain between input terminal 107 and output terminal 115. The cathode of diode 101 and the emitter of transistor 103, as illustrated, are preferably connected together by a low impedance path to retain the linear characteristics of the circuit.

Figure 2:
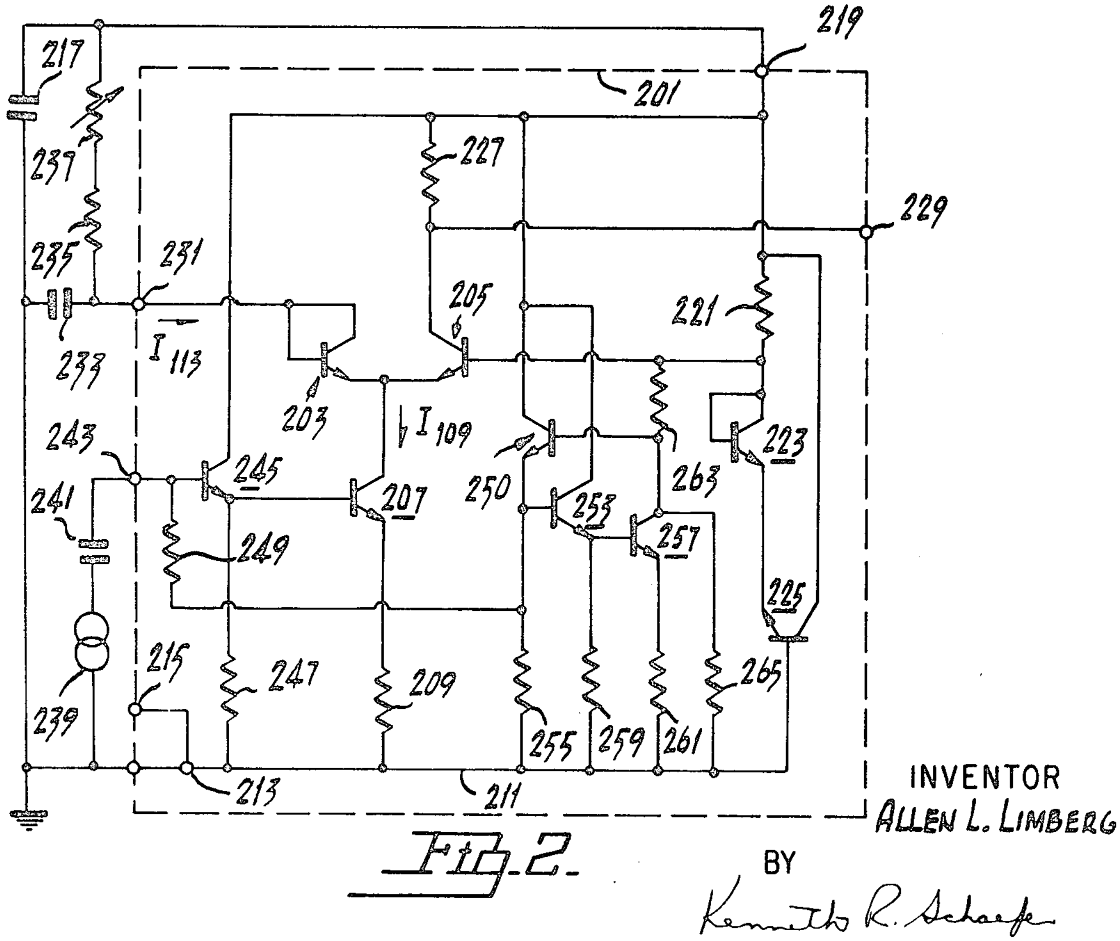
fig. 2 is a schematic circuit diagram of a modification of the embodiment of FIG. 1.

FIG. 2 is a schematic of circuit embodying principles of the present invention which is suited for construction using a combination of integrated components located upon a single monolithic silicon integrated circuit substrate 201 and a number of externally mounted discrete components. The components shown on substrate 201 will be described in terms of their construction in integrated form.

First and second NPN integrated circuit transistor structures 203 and 205, respectively, are arranged in a differential configuration. Transistor structures 203 and 205 correspond, as will appear below, to device 101 and 103 of FIG. 1. Transistor structure 203 is connected an integrate circuit diode wherein base and collector contacts are shorted together to provide an anode, and an emitter contact provides a cathode. In this embodiment, diode 203 and transistor 205 preferably are manufactured simultaneously by the same diffusion processes. Diode 203 and transistor 205 also are arranged with similar geometries and are proximate each other on the substrate 201 so they share the same terminal environment. The emitter contacts of devices 203 and 205 are joined and are coupled via appropriate metallization to the collector contacts of a third transistor structure 207. The emitter contact of transistor 207 is coupled by a diffused resistor 209 to a ground bus metallization 211, the combination of transistor 207 and resistor 209 serving as a substantially constant direct (quiescent) current sink. The ground bus 211 is connected through a chip terminal 213, representing a metallization pad, bond wire, leader wire and bonds, to an external grounding point. The substrate 201 is also connected to such grounding point through a conductive semiconductor plug and chip terminal 215. Operating potential is supplied to components on substrate 201 by means of an external source of positive direct potential 217 via a further chip terminal 219.

The base electrode of transistor 205 is biased at a substantially fixed potential offset above ground by a voltage regulator comprising the series combination of a forward-biased integrated diode structure 223 and the emitter-base junction of a transistor 225, the latter being reverse biased into an avalanche condition. Current is supplied to diode 223 and to the emitter-base of transistor 225 via a diffused resistor 221 which is coupled to chip terminal 219. The base contact of transistor 225 is connected to the ground bus 211. The collector region of transistor 225 is connected by metallization to chip terminal 219. An output terminal 229 is connected by metallization to the collector contact of transistor 205. The collector of transistor 205 also is coupled by a diffused resistor 227 to chip terminal 219. Resistors 209 and 227 preferably have similar diffusion profiles, and they are proximate upon the same substrate 201 so that they share the same thermal environment.

The base and collector contacts of diode 203 are connected by metallization to a control current terminal 231, which terminal is coupled to ground by an external bypass capacitor 233. An external source of direct control current comprising the series combination of voltage source 217, a rheostat 237 and a resistor 235 is also coupled to control terminal 231.

An external source of input signal potential 239 is coupled to the base of current sink transistor 207 by means of an external capacitor 241, chip terminal 243 and an emitter follower transistor structure 245. Specifically, terminal 432 is connected by metallization to the base contact of transistor 245. The collector region of transistor 245 is contacted and connected by metallization to potential supply terminal 219. The emitter contact of transistor 245 is connected by metallization to the base contact of transistor 207 and is coupled to the ground bus 211 by resistor 247 which may be fabricated as a pinch resistor. The base contact of transistor 245 also is coupled by means of a diffused resistor 249 to a temperature compensated source of direct biasing voltage. That is, resistor 249 is coupled to metallization which, in turn, is coupled between the emitter contact of an emitter follower transistor structure 251 and the base contact of a further transistor structure 253. The load for emitter follower transistor 251 comprises a diffused resistor 255 returned to the ground bus 211. Transistor structures 251 and 253 share a common collector region contacted and connected by metallization to supply terminal 219. The emitter contact of transistors 253 is connected by metallization to the base contact of a transistor structure 257 and is also coupled to ground bus 211 by a resistor 259 which may be fabricated as a pinch resistor. The emitter contact of transistor structure 257 is coupled to the ground metallization bus 211 by a diffused resistor 261. A potential divider formed by the series combination of diffused resistors 263 and 265 is coupled between the base contact of transistor 205 and the ground bus 211. The interconnection of resistors 263 and 265, the base contact of transistor 251 and the collector contact of transistor 257 are joined by metallization.

The integrated circuit structure is shown schematically using conventional discrete component symbols since a variety of ways exist to lay out the component diffused semiconductive transistors, diodes, avalanche diode and resistors on the chip, the present circuit even being possibly included together with other circuitry on the chip. Metallization patterns may be interrupted by low resistance diffused resistors or "tunnels" to permit one conductive path to cross over the other. It is preferable, however, to avoid use of a tunnel in the interconnection between the semiconductor diode 203 and the emitter of the common-base amplifier transistor 205 since resistance in this interconnection will cause distortion in the attenuated output signal. A tunnel may be used in portions of the metallization insensitive to increased resistance such as in series with the collector electrode of transistor 207 prior to its connection to the previously mentioned interconnection, Appropriate methods of lying out the geometry of the diffused structures are well known. The principles of the present invention apply to monolithic integrated circuits made by any of the known processes of manufacture. Hereinafter, for brevity, these integrated circuit structures will be referred to using the names of their discrete-component homologues.

In the operation of the circuit shown in FIG. 2, the combination of diode 223 and avalanche device 225 may be arranged to exhibit approximately zero temperature coefficient. For example, diode 223 may be arranged to provide approximately a 650 millivolt drop at 300° K. with a temperature coefficient of −1.75 mv./°K. The avalanche device 225 may be arranged to provide approximately 5.6 volts drop with a temperature coefficient of +1.5 mv./°K. The net temperature coefficient of the combination therefore is approximately −0.25 mv./°K. Temperature variation of other elements associated with the bias applied to the base of transistor 205 may be considered to be negligible. As a result, the base of transistor 205 may be considered for many purposes to be coupled to a substantially constant direct voltage of, for example, 6.3 volts.

The structure comprising transistors 251, 253 and 257 and resistors 255, 259, 261, 263 and 265 provides a bias voltage to the emitter-follower-driven common-emitter amplifier comprising transistors 245 and 207 and the resistors 249, 247 and 209. This bias voltage supply is such that changes in the direct bias component of voltage across resistor 209 are proportional to changes in (i.e., "track") its resistance despite changes in temperature. This tracking with temperature change of the direct bias component of voltage across resistor 209 with its resistance will cause temperature-independent direct current flow through the emitter of transistor 207. Since the collector and emitter currents of a transistor with moderate or high forward current gain are essentially the same, the collector current flow of transistor 207 also will be temperature-independent. The manner in which such temperature-independent current is obtained will be explained below. In the explanation, it will be assumed that resistor 209 (as well as other resistors with similar diffusion profiles on substrate 201) exhibits a positive temperature coefficient of resistance of 1.9 parts per thousand per degree Kelvin.

Assuming the potential drop across resistor 249 to be negligible, substantially equal potential offsets exist between the emitter of transistor 251 and the emitters of each of transistors 257 and 207 (i.e., the sum of the base-emitter junction drops of transistors 253 and 257 in the one case ad the sum of the base-emitter drops of transistors 245 and 207 in the other case). The voltage across resistors 209 and 261 therefore may be considered to be substantially equal. If, therefore, a constant current is maintained in resistor 261, a proportional (equal if R261 = R209), constant current will be maintained in resistor 209 where the temperatures and diffusion profiles of resistors 209 and 261 are alike (as is the case in the illustrated integrated circuit). In order to maintain the desired constant current in resistor 261, the voltage across resistor 261 is arranged to vary at a rate of 1.9 parts per thousand per degree Kelvin temperature change (the same rate as that at which the resistance of resistor 261 changes). This voltage variation with temperature is obtained by proportioning resistors 263 and 265 in accordance with the analysis set forth below.

The resistor 261 may be considered to be coupled in a voltage divider circuit including the parallel combination of resistors 263 and 265 (i.e., the source impedance of the voltage provided at the base of transistor 251), the three series connected base-emitter junctions of transistors 251, 253 and 257 and resistor 261. This voltage divider may be considered to be coupled across a source voltage equal to the voltage at the base of transistor 251 (i.e., the reference voltage provided at the base of transistor 205 multiplied by the ratio of resistor 263 to the sum of resistors 263 and 265). The voltage across resistor 261 may thus be expressed mathematically as:

$$V_{261}=\frac{R_{261}}{R_{261}+\frac{R_{263}R_{265}}{R_{263}+R_{265}}}\left[\frac{R_{265}}{R_{263}+R_{265}}(V_{B205})-V_{be251}-V_{be253}-V_{be257}\right]$$

The base-emitter voltages of transistors 251 and 257 may be assumed to be 650 millivolts at a temperature of 300° K. with a temperature coefficient of −1.75 millivolts/°K. Because of the arrangement of transistors 253, 257 (i.e., Darlington), the base-emitter voltage of transistor 253 may be assumed to be 550 millivolts, but with the same temperature coefficient as above. The ratio of resistances outside the bracket in the above expression does not change with temperature where the included resistors have substantially identical temperature characteristics (as is the case for the illustrated integrated circuit) and therefore may be disregarded.

The required ratio of resistor 263 to resistor 265 may be calculated by equating 1.9 parts per thousand with the ratio of the parts of change with temperature of the bracketed term in the above equation to its nominal value. The nominal values for the several parameters in the above equation and their temperature coefficients are set forth in the preceding discussion. The solution to such computation indicates that the resistance of resistor 265 should be 2.54 times that of resistor 263 for the desired temperature independent current flow in resistors 261 and 209.

In operation, the gain for signal between input port (terminals 243 and 213) and output port (terminals 229 and 213) of the attenuator will be determined by the ratio of the resistances of resistors 227 and 209, as in any resistance-ratio common-emitter transistor amplifier. However, such signal gain will be multiplied by an attenuation factor related to the splitting of signal currents between the alternative current paths offered by the collector-to-emitter paths of transistor 205 and the diode-connected transistor 203. The configuration shown in FIG. 2 has certain additional properties worthy of note. The voltage gain for a particular current splitting between the collector-to-emitter paths of transistors 203 and 205 does not change appreciably despite the fact that diffused resistors 209 and 227 may have relatively large absolute resistance tolerances (e.g., 25–30 percent). The constant voltage gain depends only upon their relative changes with temperature being similar, which is readily achieved in integrated circuit form. Since the collector current of transistor 207 is temperature-independent, if the control current flowing into terminal 231 is also temperature-independent, the current split will be temperature-independent. This means that the source of control current may be external to the chip and no problem of tracking attenuation action and control signal will arise from having to work with two disparate temperature environments.

The use of a transistor 203 as the semiconductor rectifier in the attenuator mechanism, which transistor is of similar construction to that of the common base amplifier transistor 205, permits the saturation of the two junctions performing the signal attenuation to be made similar. Monolithic silicon integrated construction of transistors 203 and 205, where the two transistors are proximate on the semiconductor die, can guarantee such similarity of structure. The saturation currents and the temperature of the two junctions will be very similar. The transistors have similar temperatures because of their physical proximity and the good thermal conductivity of the silicon die when mounted on a metal header. With the similar saturation currents in the attenuator current-dividing junctions the potential p as defined in Equation 7 will be zero. Equation 11 therefore will simplify to:

$$V_A=\frac{kT}{q}\ln\left[\frac{1}{\beta+1}\left(\frac{I_{109}}{I_{113}}-1\right)\right]$$

The function p is a nonlinear function of temperature; causing it to be negligible makes $V_A$ inversely proportioned to temperature for a particular ratio of current division, which can be useful in attenuators which are carefully temperature compensated.

The constant current sink 109 and signal current input or their equivalent often are, as shown in FIG. 2, located in the same monolithic silicon die which contains the current divider transistors (203 and 205). If current sink 109 has a fixed direct-current requirement, a fixed ratio of current splitting will be maintained if the current $I_{113}$ is held invariant. This observation is important to the design of attenuators in which the attenuation does not vary with temperature change and in which current sink 109 and the source $I_{113}$ are exposed to disparate thermal environments.

In the configuration of FIG. 2 the variable constant current supplied at terminal 231 (i.e., $I_{113}$) is generated by placing low-temperature-coefficient resistor and rheostat elements in series combination between a regulated source of operating potential 217 and terminal 231. Since the offset voltage between the terminal 231 and the base electrode of transistor 205 can be but a few millivolts unless there is no current flow through transistors 203 and 205, and since the base electrode of transistor 205 is held at an essentially temperature-independent voltage, the voltage across the resistor 235 and rheostat 237 in combination can be temperature-independent if it be large compared to the offset voltage. The variable temperature-independent resistance across which a temperature-independent potential is maintained causes a variable temperature-independent current flow through the resistance.

Figure 3:
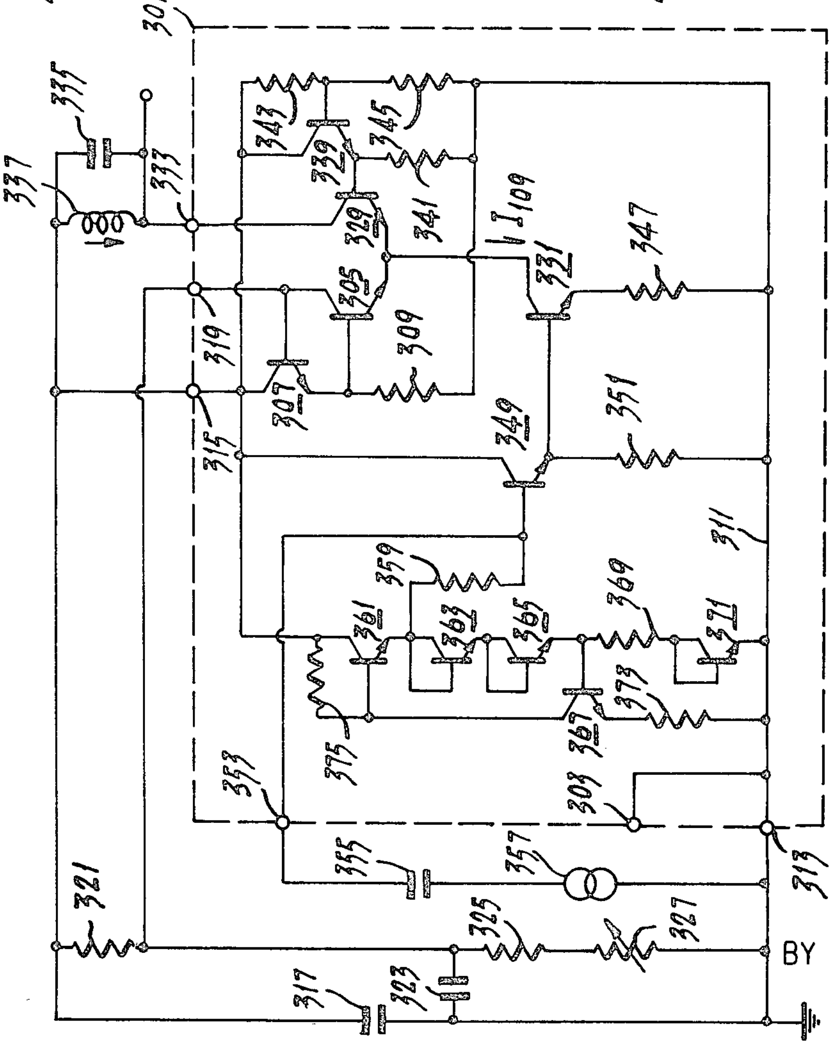
FIG. 3 is a schematic circuit diagram of a further embodiment of the invention which is substantially insensitive to variations in supply potential.

FIG. 3 is a schematic diagram of a further circuit embodying principles of the present invention. The portion of the circuit of FIG. 3 shown within the dashed outline is adapted for construction upon a single monolithic substrate 301. The circuit shown in FIG. 3, like those of FIGS. 1 and 2 includes a pair of emitter coupled semiconductor devices 329 and 305. The collector of transistor 305 is direct current coupled to a control terminal 319 and is also direct current coupled to its base by means of an emitter follower transistor 307 so as to provide diode-like operation. The collector of output transistor 329 is coupled via chip terminal 333 to an external tunable load comprising the parallel combination of a capacitor 335 and an inductor 337. A source of substantially constant quiescent (direct) current comprising the collector-emitter path of a transistor 331 and a resistor 347 is coupled between a reference potential terminal 313 (e.g., ground) and the joined emitters of transistors 305 and 329.

A source of input signals 357 is coupled to the base electrode of transistor 331 via a coupling capacitor 355, terminal 353 and an emitter follower transistor 349. A resistor 351 is coupled between the emitter of transistor 349 and terminal 313.

A temperature compensated potential divider bias supply is also coupled to the base of transistor 331 so as to produce a substantially constant quiescent current through resistor 347. The potential divider comprises a feedback arrangement of a degenerated common emitter transistor 367, a common collector transistor 361, first, second and third diode-connected transistors 363, 365, 371 and resistors 369, 373 and 375. Resistors 369 and 373 are fabricated with substantially equal resistance values while resistor 375 is fabricated with a resistance three times that of resistor 373. In such a configuration, substantially equal emitter currents flow in transistors 361 and 367. The offset voltages across each of the base-emitter junctions of transistors 361 and 367, as well as across the similarly fabricated diode-connected transistors 363, 365 and 371, are all substantially equal. It can readily be shown that the voltage produced at the base of transistor 367 in such a configuration is substantially invariant with temperature and is equal to one-fourth the voltage of source 317.

Since the voltage at the base of transistor 367 is one-fourth that afforded by the source of operating potential 317, the voltage at the emitter of transistor 361 is two base-to-emitter offsets greater than one-fourth supply potential. Assuming a negligible voltage drop in the base bias resistor 359 and one base-emitter offset for each of the transistors 349 and 331, the resistor 347 will have a direct bias potential impressed across it equal to one-fourth that of the operating potential of source 317. The voltage impressed across resistor 347, since it is in ratio to the operating potential provided by source 317, will have the same dependency upon temperature as the operating potential afforded by that supply.

Thus, where supply 317 is independent of temperature, the voltage across resistor 347 will also be independent of temperature. The emitter resistor 347 may be made invariant with temperature changes by making the doping of such diffused resistor highly concentrated; that is, by making the resistor of P+ or N+ material. Preferably, P+ material is used to permit the resistor to be of small geometry. Since, under the above conditions, resistor 347 exhibits no change in resistance as a function of temperature and since the bias voltage provided across resistor 347 is also invariant with temperature, a temperature independent quiescent bias current source is coupled to the joined emitters of transistors 305 and 329.

The base of transistor 329 is biased at a level derived from the source 317 by means of a potential divider comprising resistors 343, 345 and an emitter follower transistor 339. The base of transistor 339 is biased at a fraction of the operating potential afforded by source 317. Therefore, the base electrode of transistor 329 is biased at one base emitter voltage offset below a fraction of operating potential. The loading of the base electrode of the common base amplifier transistor 329 upon the potential divider formed from resistors 343 and 345 will be negligible because of the emitter-follower action of transistor 339.

Control signals are supplied to the illustrated attenuator circuit by means of a second variable current generator coupled to terminal 319. The current generator comprises voltage source 317 coupled in series with an external resistor 321. The supplied current is determined by the fraction of the operating potential existing between the positive terminal of source 317 and the chip terminal 319. This current is designed to be at least as large as the current provided by the first constant-current generator comprising resistor 347 and transistor 331. A second current path is coupled to the variable current generator and comprises the series combination of a resistor 325 and a rheostat 327 coupled between terminal 319 and reference potential terminal 313. The flow of current through this latter path is determined by the fraction of operating potential at terminal 319 and by the resistance of this series combination 325, 327. Altering the resistance of the rheostat 327 will change the amount of current diverted into this path. This, in turn, determines the amount of current available to flow into the chip terminal 319 from the constant current flow through the resistor 321 and determines the degree of attenuation afforded by the variable attenuator. Signals are bypassed to reference potential at terminal 319 by means of a capacitor 323.

The circuit of FIG. 3 is relatively insensitive to variations in the level of potential source 317. That is, if the potential afforded by source 317 varies, the potentials across resistor 347, across resistor 321 and across the resistance of the series combination of resistor 325 and rheostat 327 will vary in proportion thereto. The current flow through each of these resistors also will vary in the same proportion. The attenuation of the attenuator will not be altered, despite the change in potential from source 317.

In other respects, the circuit of FIG. 3 operates in a manner similar to that of the circuits of FIGS. 1 and 2. That is, variations of the control current supplied to terminal 319 (which is accomplished by varying rheostat 327) change the division of signal current supplied by transistor 331 as between transistors 305 and 329. It should be noted that the base of transistor 305 (the diverting transistor) will, throughout the control range, be at a potential which is within approximately 0.2 volts of the base of transistor 329. The base of transistor 307 (one $V_{be}$ higher) will therefore be at substantially the same voltage as that at the base of transistor 339 except for the small offset voltage noted above.

Figure 4:
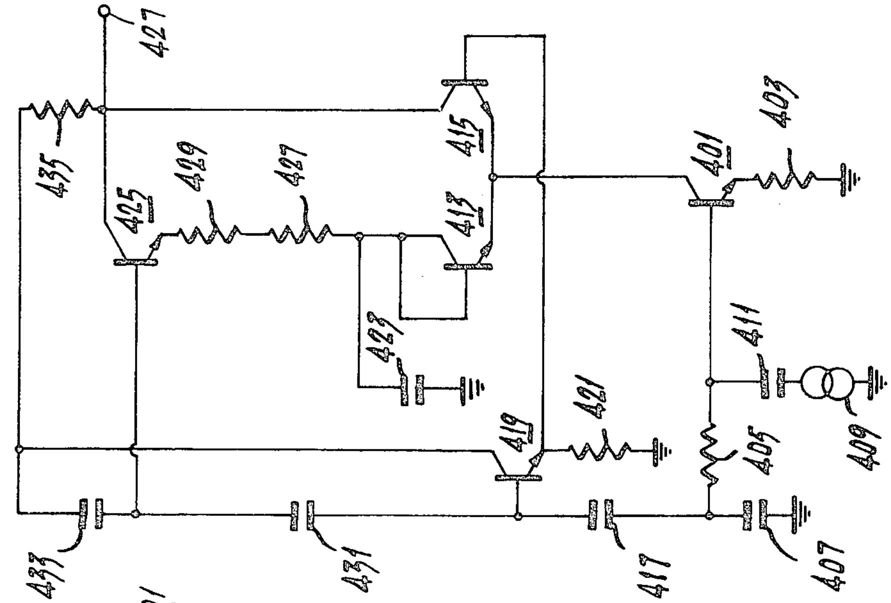
FIG. 4 is a schematic circuit diagram of a further embodiment of the invention in which the direct potential level at a signal output terminal is substantially constant as attenuation of the circuit is varied.
Figure 5:
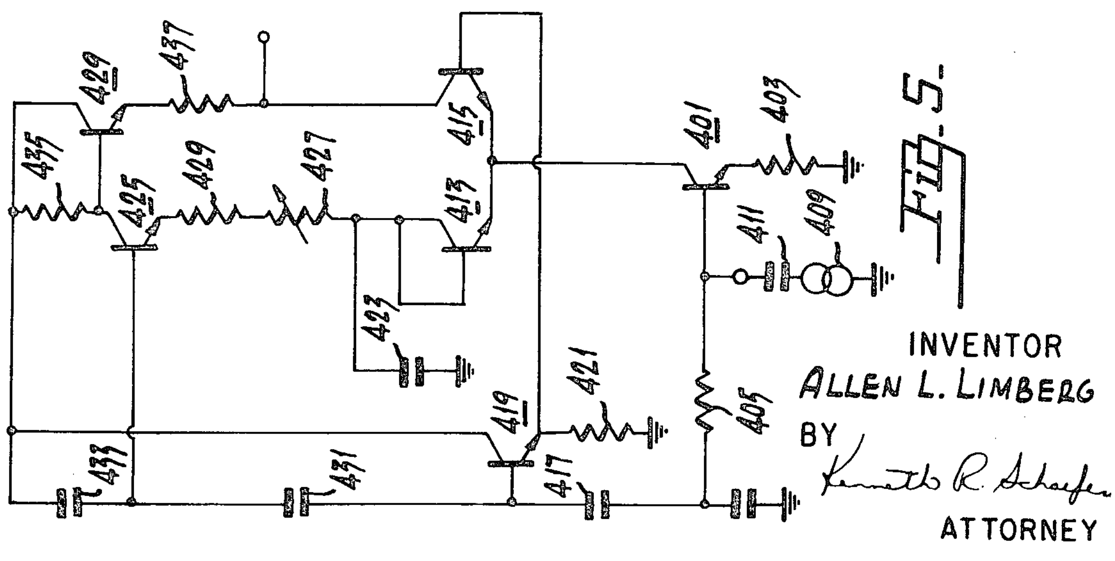
FIG. 5 is a schematic circuit diagram of a modification of the embodiment shown in FIG. 4.

FIGS. 4 and 5 are schematic diagrams of alternative configurations for variable attenuators which do not display direct potential shifts in their output signal when attenuation is varied.

In each of these configurations the first current generator is provided by the collector current flow of a transistor 401 connected as a common-emitter transistor amplifier stage with a resistor 403 coupling its emitter electrode to reference ground. A base bias resistor 405 couples the base electrode of transistor 401 to a source of positive bias potential 407. A source of input signal potential 409 is coupled to the base electrode of transistor 401 through through a coupling capacitor 411. The collector electrode of transistor 401 is connected to the interconnection of the emitter electrodes of transistors 413 and 415. A second source of positive bias potential 417, having its negative terminal connected to the positive terminal of the biasing potential source 407, has its positive terminal connected to the base electrode of a common-collector transistor 419, the emitter electrode of which is connected to the base electrode of transistor 415 and is coupled to reference ground through a resistor 421. Transistor 415 functions as the common-base amplifier state in the attenuator, and transistor 413 with its base and collector electrodes shorted together is used as the semiconductive rectifier in the attenuator. The shorted base and collector electrodes of transistor 413 are bypassed for signal to reference ground with the bypass capacitor 423 and are coupled to the emitter electrode of transistor 425 by the series combination of a rheostat 427 and a stop resistor 429. A third source of positive biasing potential 431, having its negative terminal connected to the positive terminal of the source of biasing potential 417 has its positive terminal connected to the base electrode of transistor 425. A fourth source of potential 433, having its negative terminal connected to the positive terminal of source of operating potential 431, functions at its positive terminal as a source of operating potential. The collector electrode of transistor 419 is connected to this source of operating potential. A resistor 435 couples the collector electrode of transistor 425 to this source of operating potential. The collector electrode of the common-base amplifier stage transistor 415 is connected to an output terminal 427.

In the configuration shown in FIG. 4, the collector electrode of transistor 425 is connected to the output terminal 427. In FIG. 5, however, the collector electrode of transistor 425 is connected to the base electrode of common-collector amplifier transistor 429, the collector electrode of which is connected to the positive terminal of the source of supply potential 423 and the emitter electrode of which is coupled to the output terminal through a resistor 437. The resistors 435 and 437 are of equal resistance value.

In the circuits of FIGS. 4 and 5, the collector current of transistors 401 ma be made temperature-independent by using a resistor 403 with positive-temperature-coefficient resistance and a properly selected voltage for the source of bias potential 407. The shorted base and collector electrodes of transistor 413 will, as in the prior circuits, be within a few millivolts of the potential at the base electrode of the common-base amplifier transistor 415. The voltage at the base electrode of transistor 415 is one base-emitter potential offset below that at the negative terminal of the potential source 431. The potential at the emitter electrode of transistor 425 is one base-emitter potential offset below that at the positive terminal of potential source 431. Therefore, the voltage across the series combination of rheostat 427 and resistor 429 will be essentially the same as that afforded by potential source 431. The voltage supplied by source 431 may be made substantially constant so that source 431 and the series combination of rheostat 427 and resistor 429 serves as the variable second current source for these attenuator configurations.

Current for this variable current source is supplied in either of the configurations shown in FIGS. 4 and 5 through the collector-to-emitter path of transistor 425. As was shown in the basic attenuator mechanism described in connection with FIG. 1, the sm of this current and the collector current of the common-base amplifier transistor 415 is a fixed value of current.

In the configuration shown in FIG. 4, then, it is apparent that the sum of the potential drops in equal value resistors 435 and 437 must be a constant potential. Variation of the resistance of the rheostat 427 will vary the amount of current supplied respectively through the collector-to-emitter paths of transistors 413 and 415 and, in consequence, the attenuation of the output signals seen at terminal 427. The direct bias potential at terminal 427 will not be affected by the variation of the resistance of the rheostat 437.

FIG. 4 shows a somewhat simpler alternative circuit in which the currents supplied through the alternative collector-to-emitter paths of transistors 413 and 415 are drawn through the same common load resistor 435. Since the sum of the direct component of these currents is a fixed value, the direct potential drop across the load resistor 435 must also be of fixed value.

Figure 6:
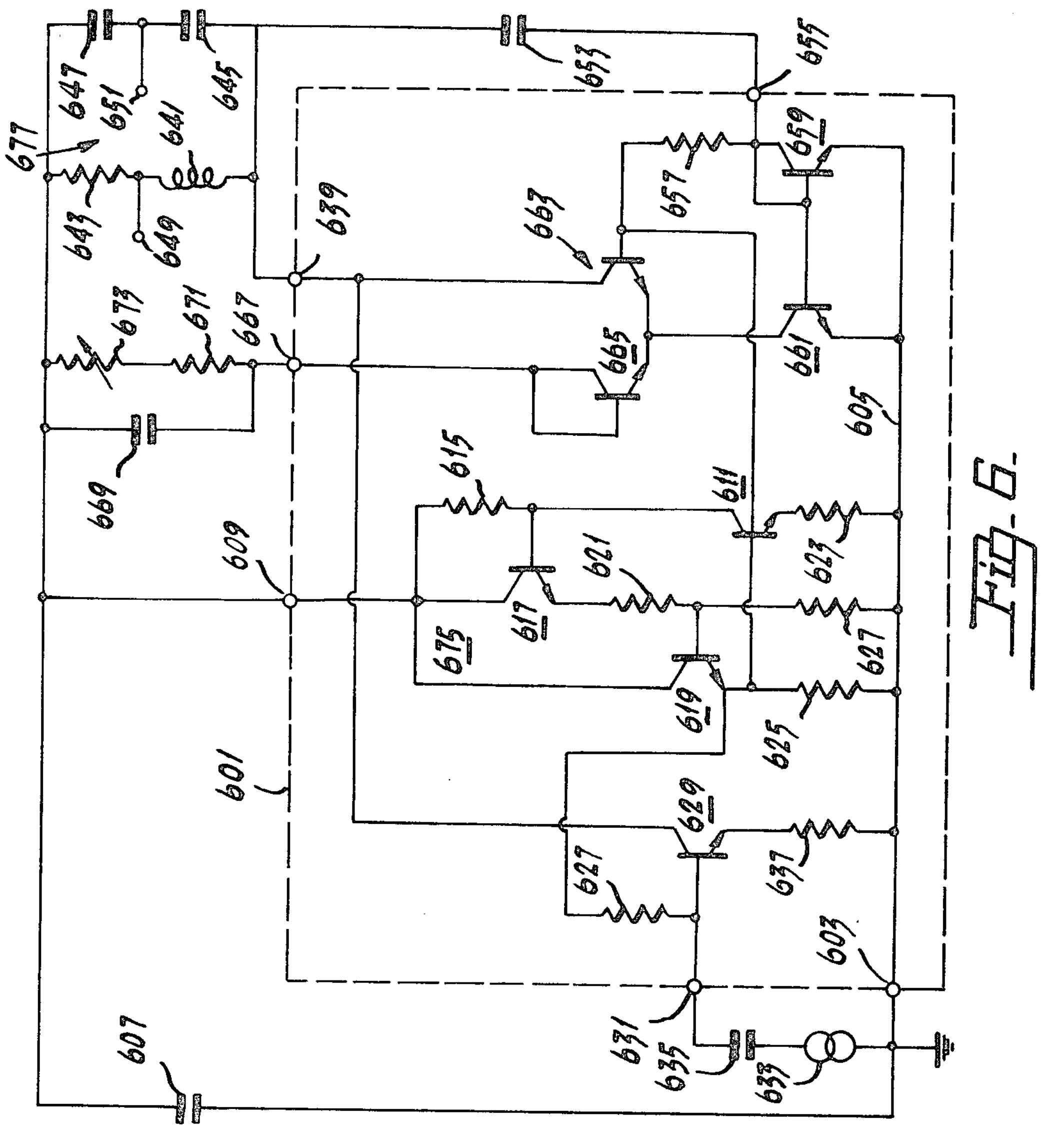
FIG. 6 is a schematic circuit diagram of an electrically controlled tint circuit employing principles of the preset invention for use in a color television receiver.

FIG. 6 is a schematic diagram of an electrically controlled tint circuit for color television usage. The circuit is suited for construction using discrete components and components integrated within the confines of a single monolithic semiconductor device. The circuit uses the principles of sampling the reactive current flow in one of the elements of an anti-resonant structure and readministering some fraction of this current sample to the anti-resonant circuit to alter its apparent frequency of anti-resonance. This apparent frequency of anti-resonance can be varied by controlling the fraction of the reactive current readministered. The principles of this electrically controlled phase shift network can, then, be utilized for controlling the frequency of an oscillator circuit. The fraction of reactive current is controlled by means of an attenuator constructed according to the present invention.

Typical operation of the circuit of FIG. 6 will be described briefly since structural and operational characteristics there at that are in many ways similar to those of previously described Figures.

In this circuit the potential of source 607 will be assumed to be 9.5 volts. The structure 675 composed of transistors 611, 617 and 619 and resistors 613, 615, 621, 623 and 625 is a potential divider constructed to provide at the emitter contact of transistor structure 619 a voltage equal to one-sixth that provided by potential source 607. To this end, the resistances of resistors 615 and 613 are in the ratio 3.5 to 1 and the resistances of resistors 621 and 623 are in the ratio of 1.5 to 1. This is in accordance with my pending U.S. application Ser. No. 57,996 entitled, A Low Output Impedance Voltage Divider Network filed July 24, 1970 and assigned to RCA Corporation. The 1.58 volts potential afforded at the emitter of transistor 619 is such that, if imposed across a series combination of a semiconductor silicon rectifier junction and a silicon diffused resistor having a temperature coefficient of resistance of 1.9 parts per thousand per degree Kelvin a substantially temperature-independent constant current will be produced in such a diffused resistor. This is the case for the combination of resistor 657 and diode-connected transistor 659. Transistor 661, the input (base-emitter) circuit of which is in parallel with that of transistor 659 will provide a collector current directly proportional to that of transistor 659. That is, the collector currents of transistors 659 and 661 are in proportion according to their geometries (areas on a typical integrated circuit) and such relationship can be maintained on an integrated circuit chip despite temperature variations. Transistors 661 therefore provides the desired temperature-independent quiescent current to the joined emitter electrodes of transistors 663 and 665 of the attenuator.

In operation, 3.58 MHz. color subcarrier signals are supplied to the base of transistor 629 from signal source 633. Amplified color signals are coupled via chip terminal 639 to an anti-resonant circuit 677 formed in part by inductor 641 and capacitors 645 and 653. A low valued resistor 643 provides a sample of inductive current in inductor 641 at terminal 649. Capacitor 647, a relatively large valued capacitor, provides a sample of the voltage across the anti-resonant circuit 677 at terminal 651. Signals produced at output terminals 649 and 651 are in quadrature phase relationship to each other and are provided at low impedances. They are suited for driving buffer amplifiers providing carrier signals to B–Y and R–Y chrominance signal detectors. The impedances of resistors 643, capacitor 647, and the diode-connected transistor 659 are all negligibly-low-impedance elements compared to reactive elements of anti-resonant circuit 677. The anti-resonant circuit 677 therefore may be considered to comprise the parallel combination of inductor 641, capacitor 645, capacitor 653, and a pseudo-capacitor afforded by the reactive collector current of transistor 663. Reactive current flow through capacitor 653 must flow through the collector-to-emitter path of the diode-connected transistor 659; and related proportional reactive current flow must occur through the collector-to-emitter path of transistor 661. Since the diode-connected transistor 659 has been biased for temperature-independent quiescent current flow, the quiescent collector current flow in transistor 661 which is related and proportional thereto will also be temperature-independent.

The structure comprising transistors 661, 663, and 665 and associated components is recognizable as a variable attenuator structure described supra permitting a controllable proportion of reactive current flow through chip terminal 639. Variation of this reactive current flow will change the natural frequency of the anti-resonant structure 677. The anti-resonant structure 677 should be tuned to 3.58 MHz. for an approximate equal current flow through the collector-to-emitter paths of transistors 663 and 665. At this setting the signal at terminal 639 will be inverted with respect to that at terminal 631 by virtue of the common-emitter amplifier employing transistor 629. As the reactive current flow through the collector electrode of transistor 663 is diminished, less capacitive reactance current flows in the anti-resonant circuit 677, raising the anti-resonant frequency above 3.58 MHz. and causing 3.58 MHz. potentials at terminal 639 to advance in phase. Increasing the reactive current flow through the collector electrode of transistor 633 will lower the anti-resonant frequency and cause 3.58 MHz. potentials at terminals 639 to be retarded in phase.

The open-loop gain of the loop comprising the reactive current measuring means and the means for reapplying a proportional reactive current to the discrete components of the anti-resonant circuit 677 is temperature-independent if the discrete components of the anti-resonant structure 677 have stable impedance characteristics with temperature change. This temperature independence does not arise from the temperature-independent current biasing of transistors 659 and 661, but is caused by the proportionalities of their respective current flows. Considering the current measurement circuit, if the input impedance of the diode-connected transistor 659 is much smaller than the reactance of capacitor 653, then to good approximation its gain, $$G_{MC} = \frac{1}{\frac{g_{m659}}{X_{C653}}} = \frac{1}{g_{m659}X_{C653}}$$

where $g_{m659}$ = transconductance of transistor 659 and $X_{C653}$ = capacitive reactance at 3.58 MHz. of capacitor 653. The gain of the signal attenuator is temperature-dependent since the necessary conditions for this (discussed with regard to the circuit of FIG. 2) exist. The maximum gain of the signal attenuator, $$G_A = g_{m661} Z_{677}$$

where $g_{m661}$ is the transconductance of transistor 661 and $Z_{677}$ is the impedance of anti-resonant structure. The total open-loop gain G is the product of $G_3$ and $G_A$.

$$G = \frac{g_{m661}}{g_{m659}} \cdot \frac{Z_{677}}{X_{C653}}$$

The transconductances of the two transistors 659 and 661 display identical proportional variation with temperature, and being on the same integrated circuit substrate 601 they experience identical temperatures; therefore, the ratio of one to the other is temperature-independent. The discrete elements determining $Z_{677}$ and $X_{C653}$ can be made temperature-independent. The reactive current through the collector electrode of transistor 661 is invariant with temperature if the reactive current flow through discrete capacitor 653 be, since these currents are in inverse relationship to $g_{m661}/g_{m659}$, proved temperature-independent supra.

Phase shift circuits of the nature just described can be built in which a current sampling capacitor corresponding to capacitor 653 is the sole actual capacitor in the anti-resonant inductor-capacitor structure. Phase shift circuits may also be constructed in which the current in the inductive leg of the anti-resonant structure is sampled and reapplied in variable proportion to the anti-resonant structure. It is also possible to sample a reactive voltage appearing in the anti-resonant structure, develop current in proportion thereto, attenuate it variably and reapply it to the anti-resonant structure to realize a variable phase shift circuit. Phase shift networks using resonant structures from which reactive currents are derived by sampling an element in the resonant structure, which currents are variably attenuated and then reapplied to the resonant structure, can be contemplated. Attenuators of the nature described in connection with FIGS. 1 through 5 are applicable to all of these schemes for realizing a variable-phase-shift network.

The electrically variable attenuator circuits herein described may function as amplitude-modulation signal generating apparatus with the electrical gain control signals modulating the amplitude of a carrier wave. The electrically variable phase shift circuits herein described may function as phase- or frequency-modulation signal generating apparatus with the electrical phase shift control signals modulating the angular displacement of a carrier wave.

What is claimed is:

1. A variable attenuator for electrical signal currents comprising:
   first and second semiconductor devices, said first device having at least first and second electrodes and said second device having at least first, second and third electrodes, the second electrodes of said devices being coupled to a common circuit junction;
   bias current means coupled to said junction for providing forward bias direct current components to each of said devices, said bias current means comprising a transistor including a collector electrode direct current coupled to said junction, a base electrode and an emitter electrode and means coupled between said base and emitter electrodes for establishing a substantially constant quiescent current between said emitter and collector electrodes;
   means coupled to said junction for supplying signal currents to said devices;
   means coupled to said first electrode of said first device for bypassing signal currents to a point of reference potential;
   means coupled to said first electrode of said first device for supplying a variable control current to said first device so as to vary proportioning of signal currents between said first and second devices; and
   output signal utilization means coupled between said first and third electrodes of said second device for deriving output signals determined by said input signals and said control current.

2. A variable attenuator for electric signal currents in accordance with claim 1 wherein:
   said means for supplying a variable control current comprises a variable resistance element and
   a source of operating potential in series combination with said variable resistance element, said series combination being coupled to said first electrode of said first device, said source of operating potential being so poled in said series combination to cause said control current to flow in a forward direction between said first and second electrodes of said first device.

3. A variable attenuator in accordance with claim 1 wherein:
   said means for supplying variable control current comprises first and second resistive elements, at least one of which has a variable resistance;
   a source of operating potential coupled in a first series combination with said first resistive element, said first series combination being coupled between said point of reference potential and said first electrode of said second device;
   said second resistive element being coupled in series combination with said source and also being connected between said point of reference potential and said first electrode of said second device.

4. A variable attenuator in accordance with claim 1 wherein:
   each of said first and second devices comprises a like semiconductor junction between said first and second electrodes, said second device further comprising an additional semiconductor junction between said first and third electrodes,
   each of said bias and control currents being in a forward current direction through junctions between respective second and first electrodes of said devices.

5. A variable attenuator in accordance with claim 4 wherein:
   said first device further comprises a third electrode and
   means for direct current coupling said third electrode to said first electrode of said first device.

6. A variable attenuator in accordance with claim 5 wherein:
   said direct current coupling means couples said control current to said first electrode of said first device.

7. A variable attenuator in accordance with claim 6 wherein:
   said first device comprises a second transistor and said second device comprises a third transistor, each having base, emitter and collector electrodes corresponding, respectively, to said first, second and third electrodes.

8. A variable attenuator in accordance with claim 7 wherein:
   said third transistor is arranged in a common base configuration, and
   said signal utilization means comprises a load impedance coupled between said collector electrode of said third transistor and a source of energizing potential.

9. A variable attenuator in accordance with claim 8 wherein:
   said bias current means comprises an emitter resistor coupled between said emitter electrode and a source of direct bias potential.

10. A variable attenuator in accordance with claim 9 wherein:

said source of direct bias potential comprises means coupled to said base electrode of said transistor of said bias current means for supplying a temperature-compensated bias voltage so as to produce a temperature-independent, constant bias current in said emitter resistor.

11. A variable attenuator in accordance with claim 9 wherein:

said means for supplying input signals is coupled to said base electrode of said transistor of said bias current means.

12. A variable attenuator in accordance with claim 8 wherein:

at least said load impedance and said bias current means are disposed within the confines of a single monolithic semiconductor body and comprise:

first and second similarly diffused resistor structures, said collector electrode of said transistor in said bias current means being direct coupled to the joined emitters of said second and third transistors;

means connecting said second resistor between said emitter electrode of said bias current means transistor and a bias reference potential;

means for applying biasing potential between said base and emitter electrodes of said last-named transistor to cause constant current flow essentially independent of variation of the temperature of said monolithic semiconductor body, in said second resistor structure; and means for applying input signal currents to said base electrode of said last-named transistor.

13. A variable attenuator in accordance with claim 1 wherein:

said bias current means comprises an emitter resistor coupled between said emitter electrode and a source of direct bias potential.

14. A variable attenuator in accordance with claim 13 wherein:

said source of direct bias potential comprises means coupled to said bias electrode of said transistor of said bias current means for supplying a temperature-compensated bias voltage so as to produce a temperature-independent, constant bias current in said emitter resistor.

* * * * *